(12) United States Patent
Lee et al.

(10) Patent No.: US 7,265,705 B1
(45) Date of Patent: Sep. 4, 2007

(54) OPAMP AND CAPACITOR SHARING SCHEME FOR LOW-POWER PIPELINE ADC

(75) Inventors: Byung-Geun Lee, Nashua, NH (US); Byung-Moo Min, Lexington, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/463,813

(22) Filed: Aug. 10, 2006

(51) Int. Cl.
*H03M 1/34* (2006.01)
(52) U.S. Cl. ...................... 341/162; 341/160
(58) Field of Classification Search ......... 341/140–170
See application file for complete search history.

(56) References Cited

U.S. PATENT DOCUMENTS 6,724,338 B1 * 4/2004 Min et al. ............ 341/155
6,954,169 B1 * 10/2005 Min ..................... 341/161
7,148,833 B1 * 12/2006 Cho et al. ............. 341/162

OTHER PUBLICATIONS

Iuri Mehr et al., "A 55-mW, 10-bit, 40-Msample/s Nyquist-Rate CMOS ADC," IEEE Journal of Solid-State Circuits, vol. 35, No. 3, Mar. 2000, pp. 318-325.

Byung-Moo Min et al., "A 69-mW 10-bit 80-MSample/s Pipelined CMOS ADC," IEEE Journal of Solid-State Circuits, vol. 38, No. 12, Dec. 2003, pp. 2031-2039.

Dan Kelly et al., "A 3V 340mW 14b 75MSPS CMOS ADC with 85dB SFDR at Nyquist," 2001 IEEE International Solid-State Circuits Conference, 3 pages.

* cited by examiner

*Primary Examiner*—Lam T. Mai
(74) *Attorney, Agent, or Firm*—Patent Law Group LLP; Carmen C. Cook

(57) ABSTRACT

A first stage circuit for a high-speed, high-resolution pipeline analog-to-digital converter (ADC) implements operational amplifier (opamp) sharing and capacitor sharing to combine the sample-and-hold (SAH) and the MDAC (multiplying digital to analog converter) functions in the first residue stage of the pipeline ADC. In one embodiment, the first stage circuit includes a sampling capacitor, an amplifier, a feedback capacitor array and a comparator. The sampling capacitor and the feedback capacitor array are configured by switches to operate in a sampling/MDAC mode, a discharge mode and a hold mode. In this manner, the sample-and-hold operation and the MDAC operation are merged into the first stage circuit of the pipeline ADC to achieve low power and high speed of operation.

20 Claims, 6 Drawing Sheets

OPAMP AND CAPACITOR SHARING SCHEME FOR LOW-POWER PIPELINE ADC

FIELD OF THE INVENTION

The invention relates to analog-to-digital converter circuits and, in particular, to a pipeline analog-to-digital converter utilizing opamp and capacitor sharing in a first stage circuit to achieve low power in operation.

DESCRIPTION OF THE RELATED ART

Electronics systems, such as communication or imaging system, often require a high-speed, high-resolution analog-to-digital converter (ADC) core that can be operated at low supply voltage and with low power consumption. A switched-capacitor pipeline ADC architecture is one common implementation of a high-speed, high-resolution ADC core. FIG. 1 is a circuit diagram of the input stages of a conventional switched-capacitor pipeline ADC. In the conventional pipeline ADC, the input stages include a sample-and-hold (SAH) circuit, typically a switched-capacitor circuit, and an MDAC (multiplying digital to analog converter) block as the first residue stage (or the first stage) of the pipeline ADC. While a pipeline ADC architecture realizes high-speed and high resolution analog-to-digital conversion, such ADC architecture often consumes a lot of power. In the case of the conventional pipeline ADC architecture of FIG. 1, the SAH circuit alone consumes almost 20%~30% of total power consumed by the ADC circuit. Consequently, when power saving is important, removing the SAH circuit becomes an attractive option, even though the SAH circuit plays an important role in ADC operation.

One implementation of a high-speed, high-resolution ADC core using a pipelined architecture without a dedicated sample/hold amplifier circuit at the input to achieve low power is described in I. Mehr et al., "A 55-mW, 10-bit, 40-Msample/s Nyquist-rate CMOS ADC," IEEE Journal of Solid-State Circuits, Volume 35, Issue 3, March 2000, pp. 318-325. FIG. 2 duplicates FIG. 4 of the Mehr et al. reference and illustrates the input sampling networks for the MDAC block and the flash comparator inside the first stage of the ADC pipeline architecture. In the first stage of the ADC pipeline architecture of Mehr et al., the input sample-and-hold circuit is absent and instead, the MDAC block, together with the flash comparator bank, is configured to perform both the sampling and the conversion operations.

While the pipeline ADC architecture described by Mehr et al., with the removal of the SAH circuit, successfully reduces power consumption, the ADC architecture has critical drawbacks due to the absence of a SAH circuit. First, because of the small feedback factor (⅓ of the conventional feedback factor used) and short comparison time placed between the sampling phase and the hold phase, the first stage MDAC block cannot operate at high speed without increasing power. Second, voltage mismatches between the input networks and the flash comparators can introduce significant sampling errors, especially, when high frequency signal is applied to the ADC. The mismatches arise due to the fact that, with the absence of the SAH circuit, the input AC signal does not get sampled and held. Therefore, the MDAC amplifier and the flash comparator bank are sampling the input AC signal directly which can have significant voltage variations during sampling, particularly for a high frequency signal.

DETAILED DESCRIPTION OF THE PREFERRED EMBODIMENTS

In accordance with the principles of the present invention, a first stage circuit for a high-speed, high-resolution pipeline analog-to-digital converter (ADC) implements operational amplifier (opamp) sharing and capacitor sharing to combine the sample-and-hold (SAH) and the MDAC (multiplying digital to analog converter) functions in the first residue stage of the pipeline ADC. In this manner, the pipeline ADC can achieve low power while preserving the sample-and-hold function to enhance the performance of the ADC. A pipeline ADC incorporating the first stage circuit of the present invention can achieve high speed of operation, high resolution and also low power dissipation.

The pipeline ADC of the present invention achieves power savings by reducing opamp load capacitance and by sharing of one amplifier for both of the SAH and MDAC functions. Furthermore, the capacitor array is shared to enable the first stage circuit to operate at high speed. In this manner, low power operation is achieved without sacrificing speed or accuracy. By preserving the SAH function and merging it into the first stage circuit, the ADC circuit of the present invention avoids the shortcomings of the conventional ADC where the SAH circuit is eliminated entirely to reduce power consumption. Thus, the ADC circuit of the present invention can be operated at high speed and does not suffer from voltage mismatch issues that lead to sampling errors.

Figure 4:
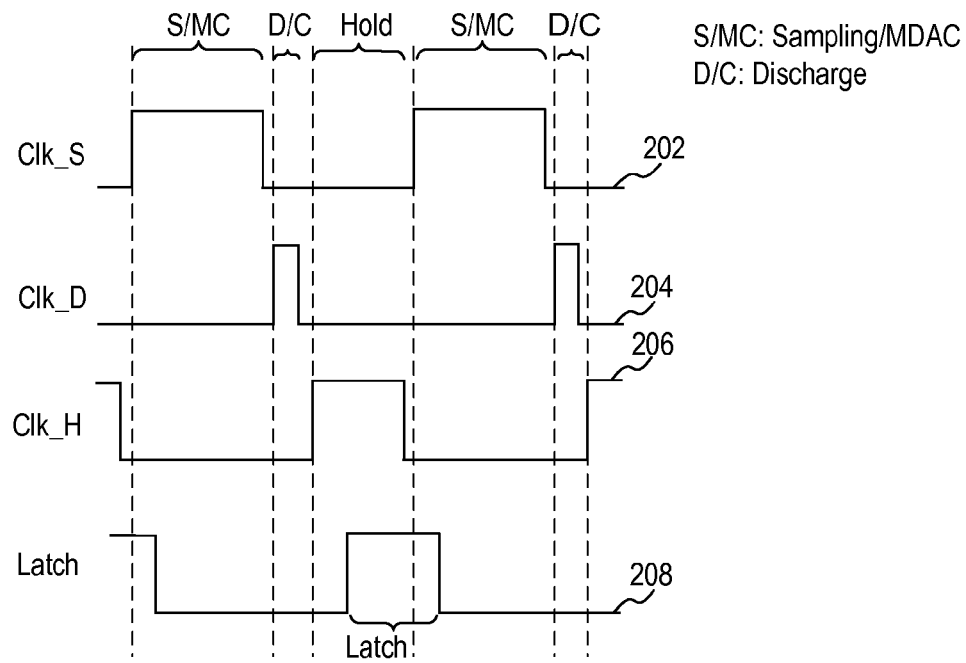
FIG. 4 is a timing diagram of the clock signals used to control the first stage circuit of FIG. 3.
Figure 2:
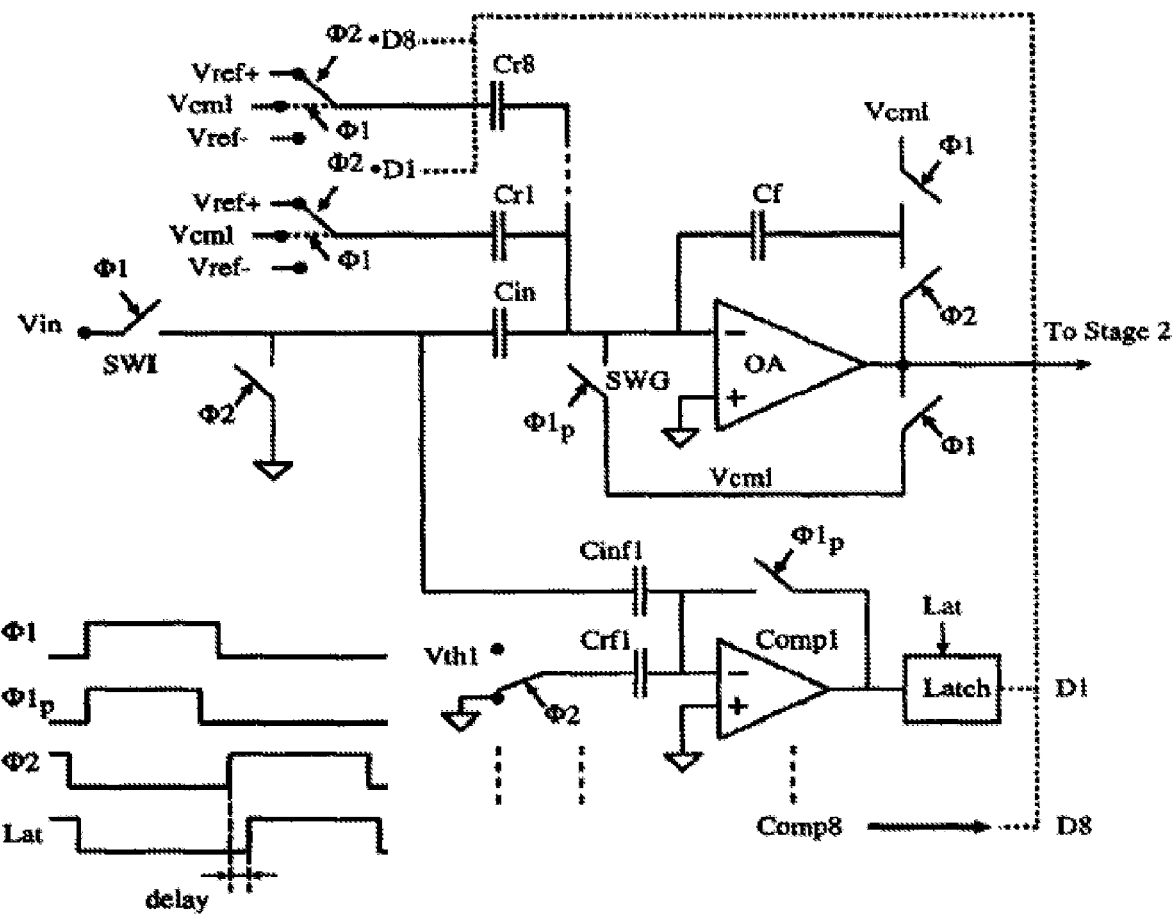
FIG. 2 duplicates FIG. 4 of the Mehr et al. reference and illustrates the input sampling networks for the MDAC block and the flash comparator inside the first stage of the ADC pipeline architecture.
Figure 3:
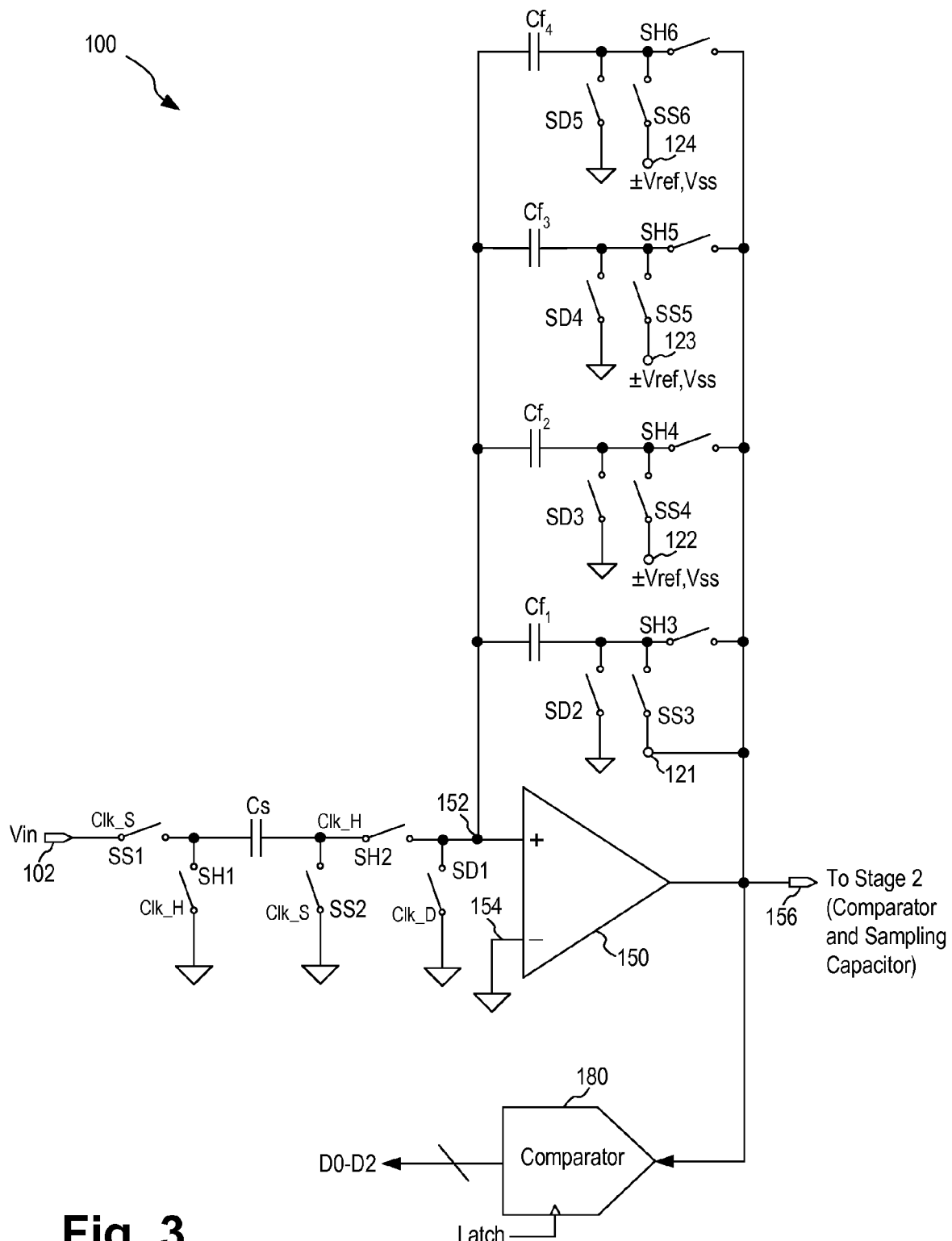
FIG. 3 is a circuit diagram of a first stage circuit for a pipeline ADC implementing both the sample-and-hold and MDAC functions using a shared opamp and shared capacitor scheme according to one embodiment of the present invention.

FIG. 3 is a circuit diagram of a first stage circuit for a pipeline ADC implementing both the sample-and-hold and MDAC functions using a shared opamp and shared capacitor scheme. FIG. 4 is a timing diagram of the clock signals used to control the first stage circuit of FIG. 3. Referring to FIG. 3, a first stage circuit 100 of a pipeline ADC receives an analog input voltage Vin on an input terminal 102 and provides a first stage residue value on an output terminal 156. The output terminal 156 of first stage circuit 100 is to be coupled to the second stage (Stage 2) of the pipeline ADC to continue the digital conversion process. It is well known in the art that in a pipeline ADC, the first stage residual value is coupled to a comparator bank to compare the residue value for the second stage and the first stage residue value is also coupled to the sampling capacitor of the second stage. The structure of the subsequent stages of the pipeline ADC is not critical to the practice of the present invention and the first stage circuit of the present invention can be coupled to work with a second pipeline stage of a pipeline ADC having any structure or design.

First stage circuit 100 includes a sampling capacitor Cs switchably connected for sampling the input voltage Vin and an amplifier 150 configured as an operational amplifier (opamp). Opamp 150 has a positive input terminal 152 switchably connected to the sampling capacitor Cs, a negative input terminal 154 connected to the Vss or ground voltage and an output terminal 156. The Vss voltage can be the ground voltage or it can be a negative power supply voltage. The output terminal 156 of opamp 150 provides the first stage residue value to the second stage of the pipeline ADC when first stage circuit 100 is configured to perform MDAC operation, as will be described in more detail below.

First stage circuit 100 also includes a feedback capacitor array coupled in a feedback configuration around opamp 150. In the present embodiment, first stage circuit 100 implements a 2.5 bits pipeline stage where four feedback capacitors $Cf_{1-4}$ are included in the feedback capacitor array. In other embodiments, the first stage circuit can implement a pipeline stage having other resolution and different numbers of feedback capacitors will be provided in the feedback capacitor array, as will be described in more detail below. Feedback capacitors $Cf_{1-4}$ have the same capacitance values and sampling capacitor Cs has a capacitance value of 4Cf.

Each of feedback capacitors $Cf_{1-4}$ has a first plate connected to the positive input terminal 152 of opamp 150 and a second plate switchably connected to the output terminal 156 of opamp 150 to form the feedback path. The second plate of each of feedback capacitors $Cf_{1-4}$ is also switchably connected to the Vss or ground voltage for the discharge operation (to be described). The second plate of each of feedback capacitors $Cf_{2-4}$ is further switchably connected to a reference voltage node 122-124, respectively.

First stage circuit 100 includes a comparator 180 having an input terminal coupled to the output terminal 156 of opamp 150 and generating a digital control signal D0-D2 for the MDAC operation. In operation, comparator 180, controlled by the Latch signal, samples the signal previously sampled and being held on feedback capacitors $Cf_{1-4}$. In the present embodiment, the digital decision generated by comparator 180 is a three-bit signal D0-D2. The number of bits for the digital control signal may differ in other embodiments of the present invention. The digital control signal D0-D2 is then available for use by first stage circuit 100 for the MDAC operation in the subsequent sample/MDAC phase. Digital decision D0-D2 is coupled to select one of the reference voltage (+Vref, −Vref, or Vss) to be coupled to the reference voltage nodes 122 to 124. Comparator 108 is typically an n-bit flash converter and can be implemented using any comparator structure currently known or to be developed.

As described above, the first stage residue value provided by first stage circuit 100 is coupled to a comparator to be compared so as to generate a digital control signal for the second pipeline stage. The number of resolved bits provided to the second stage depends on the resolution of the second stage. In some application, the same comparator 180 is also used for comparing the first stage residue value as well as for comparing the sampled-and-held input voltage value to generate the digital decision D0-D2 as the two comparisons are performed at different times.

First stage circuit 100 includes an array of switches operating under the clock signals in FIG. 4 to configure the first stage circuit to carry out both the SAH and the MDAC operations. More specifically, first stage circuit 100 includes three operation modes—a sampling/MDAC mode, a discharge mode and a hold mode. The three operation modes are carried out in sequential phases where the sampling/MDAC phase, the discharge phase and the hold phase are successively repeated. The array of switches implements opamp and capacitor sharing in first stage circuit 100 so that the same opamp 150 and the same array of feedback capacitors $Cf_{1-4}$ are used for both the SAH function and the MDAC function.

In the embodiment shown in FIG. 3, the switches in first stage circuit 100 fall into three groups based on the clock signal being used to control the switch. First stage circuit 100 operates under the control of clock signals Clk_S, Clk_D, and Clk_H (FIG. 4) where Clk_S controls the sampling/MDAC phase, Clk_D controls the discharge phase, and Clk_H controls the hold phase of the first stage circuit. In the present description, switches in first stage circuit 100 that are controlled by clock signals Clk_S are denoted as switch "SSn", switches that are controlled by clock signals Clk_D are denoted as switch "SDn", and finally switches that are controlled by clock signals Clk_H are denoted as switch "SHn". In FIG. 3, because the switch name refers to the clock signal controlling the switch, the clock signal driving each switch is omitted from the figure to simplify the drawing.

More specifically, in first stage circuit 100, switches SS1 and SS2 are coupled to sampling capacitor Cs to enable the sampling capacitor to sample the input voltage Vin. Switch SS1 is coupled between the input terminal 102 receiving the input voltage and a first plate of capacitor Cs. Switch SS2 is coupled between a second plate of capacitor Cs and the Vss or ground voltage. Meanwhile, switches SS3 to SS6 are coupled between the second plate of respective feedback capacitors $Cf_1$ to $Cf_4$ and respective reference voltage nodes 121 to 124. Switches SS3 to SS6 configure the feedback capacitor array for performing the MDAC function. The reference voltage node 121 is connected to output terminal 156 of opamp 150 to allow capacitor $Cf_1$ to be connected in the feedback path during the MDAC operation. Reference voltage nodes 122 to 124 are each connected to a reference voltage selected from a positive reference voltage (+Vref), a negative reference voltage (−Vref), and the Vss or ground voltage. The selection of the specific reference voltage (+Vref, −Vref or Vss) for each of feedback capacitors $Cf_2$ to $Cf_4$ is based on the digital control signal D0-D2.

First stage circuit 100 also includes switches SH1 to SH6 to configure sampling capacitor Cs and the feedback capacitor array for the hold operation. When switches SH1 to SH6 are closed, the second plates of feedback capacitors $Cf_1$ to $Cf_4$ are connected to the output terminal 156 of opamp 150 and the feedback capacitors are thus configured in the feedback path of opamp 150. Finally, first stage circuit 100 includes switches SD1 to SD5 to configure the feedback capacitor array for the discharge operation. The operation of the first stage circuit 100 under the three operation modes will be described in more detail below.

In the embodiment shown in FIG. 3, switches SS3 and SH3 are both used to connect the second plate of capacitor $Cf_1$ to the output terminal 156 of opamp 150. The embodiment shown in FIG. 3 realizes symmetry where each feedback capacitor is given the same configuration. However, in other embodiments, the use of two switches SS3 and SH3 is not necessary and a single switch can be used to connect the second plate of capacitor $Cf_1$ to the output terminal 156 of opamp 150, where the single switch will be controlled by the logical "OR" of clock signals Clk_S and Clk_H.

Under the shared capacitor scheme of the present invention, the same feedback capacitor array of the first stage circuit is used for the sample-and-hold operation and the MDAC operation. In accordance with the present invention, when the first stage circuit is performing the SAH operation, the entire feedback capacitor array is connected in the feedback path of the operational amplifier. However, when the first stage circuit is performing the MDAC operation, only one of the feedback capacitors in the capacitor array is connected in the feedback path while the other feedback capacitors are coupled to their respective reference voltage nodes. In the embodiment shown in FIG. 3, a fixed feedback capacitor, capacitor $Cf_1$, is used to form the feedback path during the MDAC operation. The configuration shown in FIG. 3 is illustrative only and is not intended to be limiting. In other embodiments, another feedback capacitor $Cf_2$, $Cf_3$, or $Cf_4$ may be used to form the feedback path for the MDAC operation. The operation of the first stage circuit 100 of FIG. 3 requires only that one of the feedback capacitors of the array be connected in the feedback path of the opamp and the one feedback capacitor can be any one of the feedback capacitors in the capacitor array.

In another embodiment of the present invention, a fixed feedback capacitor is not used but instead any one of the feedback capacitors in the capacitor array can be programmably selected to be used in the feedback path while the other feedback capacitors in the array are connected to the reference voltage nodes. The programmable selection of one feedback capacitor from the capacitor array for use in the feedback path is a technique commonly referred to as capacitor swapping. Capacitor swapping can be advantageously applied to overcome capacitor mismatch effects. The use of capacitor swapping in the feedback capacitor array will be described in more detail below with reference to FIG. 7.

Furthermore, the above descriptions provide one configuration of switches to allow the first stage circuit to operate in the three modes of operation for merging the SAH and MDAC operations into a single pipeline stage. One of ordinary skill in the art, upon being apprised of the present invention, would appreciate that other arrangements and configurations of switches may be used to realize the same circuit functions. The exact arrangement of the switches is not critical to the practice of the present invention as long as the first stage circuit can be configured in the three operation modes for performing both the SAH and MDAC operations.

The operation of first stage circuit 100 will now be described with reference to FIGS. 3 and 4 and also to FIGS. 5(*a*), 5(*b*) and 5(*c*) which are equivalent circuit diagrams of the first stage circuit of FIG. 3. As described above, the operation of first stage circuit 100 includes three modes—a sampling/MDAC mode, a discharge mode and a hold mode. The three operation modes are successively repeated to form the different operation phases of first stage circuit 100.

Figure 5C:
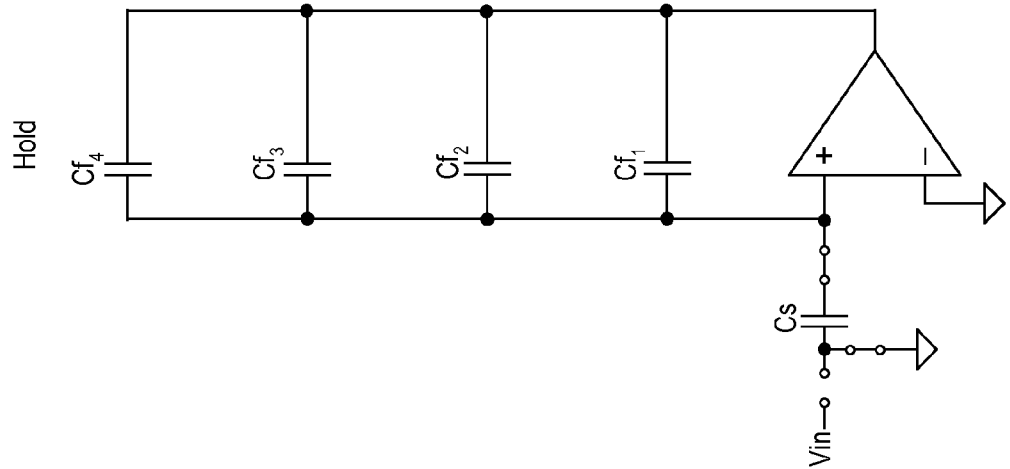
FIGS. 5(a), 5(b) and 5(c) are equivalent circuit diagrams of the first stage circuit of FIG. 3 illustrating the configuration of the first stage circuit under each of the three operation modes.
Figure 5B:
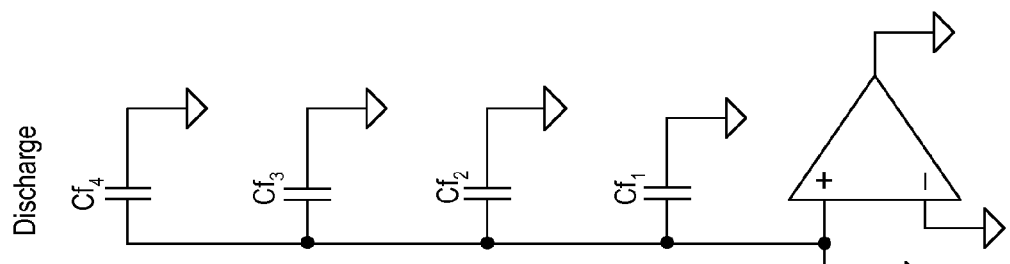
Figure 5A:
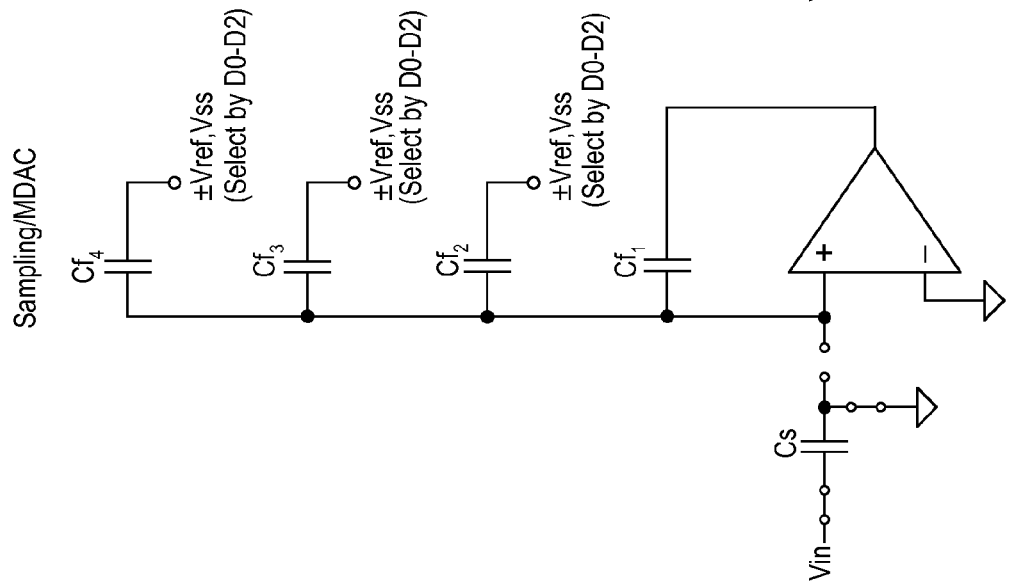

During the sampling/MDAC phase, switches SS1 and SS2, under the control of clock signal Clk_S, are closed to connect sampling capacitor Cs across the input voltage Vin and the ground voltage, as shown in FIG. 5(*a*). As a result, input voltage Vin is sampled onto capacitor Cs. Meanwhile, opamp 150 is configured for MDAC operation. Switches SS3 to SS6, under the control of clock signal Clk_S, are also closed so that feedback capacitor $Cf_1$ is connected in a feedback configuration with opamp 150 while feedback capacitors $Cf_2$ to $Cf_4$ are connected to the respective reference voltage nodes 122 to 124. The reference voltage (+Vref, −Vref or Vss) selected for each of the reference voltage nodes 122 to 124 is determined by the digital control signals D0 to D2 based on the sampling of the sampled-and-held signals from the previous hold phase. The MDAC operation provides the first stage residue value at the output of opamp 150 for the next pipeline stage in the ADC.

After the sampling/MDAC phase, first stage circuit 100 is placed in the discharge phase. During the discharge phase, switches SD1 to SD5, under the control of clock signals Clk_D, are closed while all other switches are open. Sampling capacitor Cs is left floating as shown in FIG. 5(*b*) and therefore retains the charge sampled from the previous sampling/MDAC phase. Furthermore, feedback capacitors $Cf_1$ to $Cf_4$ have both plates connected to the Vss or ground voltage (FIG. 5(*b*)) so that all charge stored thereon are removed. In this manner, feedback capacitors $Cf_1$ to $Cf_4$ are fully discharged to obviate any memory effect from the previous sampling/MDAC phase.

Then, during the hold phase, switches SH1 to SH6, under the control of clock signal Clk_H, are closed while all other switches are open. Sampling capacitor Cs is now connected to the positive input terminal 152 of opamp 150 and all four feedback capacitors $Cf_1$ to $Cf_4$ are connected in the feedback path, as shown in FIG. 5(*c*). The sampled input signal on capacitor Cs is therefore transferred to $Cf_1$ to $Cf_4$. The voltage magnitude at the opamp 150 output terminal during the hold phase is the same as the magnitude of the input voltage because Cs=4Cf.

Meanwhile, the Latch signal (FIG. 4) is also asserted to cause comparator 180 to sample the held voltage at the output terminal 156 of opamp 150. Comparator 180 generates the digital control signals D0 to D2 to be used in the subsequent MDAC operation.

It is instructive to note that because of capacitor discharging operation between the sampling phase and the hold phase, the hold time required for the first stage circuit is shorter than that of the conventional ADC by 20~30%. Thus, a faster opamp can be used to keep the sampling rate the same.

The operation of first stage circuit 100 then returns to the sampling/MDA phase. The sampling/MDAC, discharge and hold phases are repeated to successively sample and convert the input voltage Vin. In particular, the operation sequence of first stage circuit 100 is as follows. At the first sampling phase, the first sample of the input voltage Vin is obtained. Then the feedback capacitors are discharged in the discharge phase and the first sample is transferred to the feedback capacitors during the hold phase. The digital control signals D0-D2 for the MDAC operation are also generated during the hold phase.

Then, at the next sampling/MDAC phase, the second sample is obtained while the MDAC operation is carried out on the first sample. The first stage residue value for the first sample is thus generated. The feedback capacitors are again discharged and the second sample is transferred to the feedback capacitors during the hold phase while the digital control signals are again generated for the second sample. The operation continues with the sampling of the third sample and MDAC operation on the second sample.

In the first stage circuit of the present invention, a discharge phase is included between the sampling/MDAC phase and the hold phase to remove old data stored on feedback capacitors $Cf_1$ to $Cf_4$. The discharge phase can be carried out using as short a clock duration as necessary to discharge the feedback capacitors. The relative duration of clock signal Clk_D to clock signals Clk_S and Clk_H shown in FIG. 4 is illustrative only and is not intended to be limiting. In most applications, a very short pulse for clock Clk_D is required to discharge the feedback capacitors $Cf_1$ to $Cf_4$. Furthermore, in other embodiments, other methods for discharging feedback capacitors $Cf_1$ to $Cf_4$ can be used.

In the embodiment shown in FIG. 3, the first stage circuit is implemented as a 2.5 bits MDAC stage where four feedback capacitors Cf's are used in the feedback path. The first stage circuit of the present invention can be applied to implement MDAC stages having other resolutions, such as 1.5 bits, 2.5 bits and 3.5 bits. It is understood that the feedback capacitors are divided depending on the number of resolved bits for the MDAC stage. For instance, for an 1.5 bit stage, 2 feedback capacitors are used. For a 2.5 bit stage, 4 capacitors are used. For a 3.5 bit stage, 8 capacitors are used. Depending on the number of feedback capacitors used, the capacitance of the sampling capacitor Cs is also modified accordingly. In general, Cs=m*Cf where m is the number of feedback capacitors used.

The first stage circuit of the present invention implementing opamp and capacitor sharing has many advantages when applied in a pipeline ADC. An important feature of the first stage circuit of the present invention is that the SAH operation is merged into the first MDAC stage, instead of being eliminated. Accordingly, the pipeline ADC of the present invention can achieve low power as well as high speed of operation.

As described above, one prior art solution to power reduction in pipeline ADC is the removal of the sample-and-hold stage altogether. Such an ADC suffers from mismatch problems between the input networks because in the absence of the SAH, the comparator bank has to directly sample the analog input signal which is a moving AC signal. However, the first stage circuit of the present invention does not suffer from mismatch problems as the SAH function is merged in with the MDAC function so that the AC input signal is sampled into a DC signal and held by the first stage circuit. The first stage circuit of the present invention thus provides better performance over the prior art solutions.

Figure 6B:
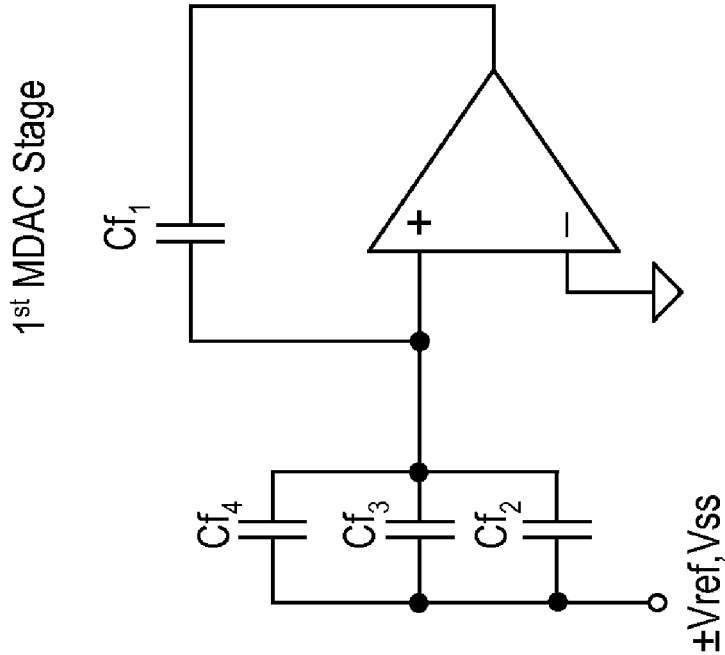
FIGS. 6(a) and 6(b) are equivalent circuit diagrams of the first stage circuit of FIG. 3 illustrating the configuration of the first stage circuit in the Hold mode and in the MDAC mode.
Figure 6A:
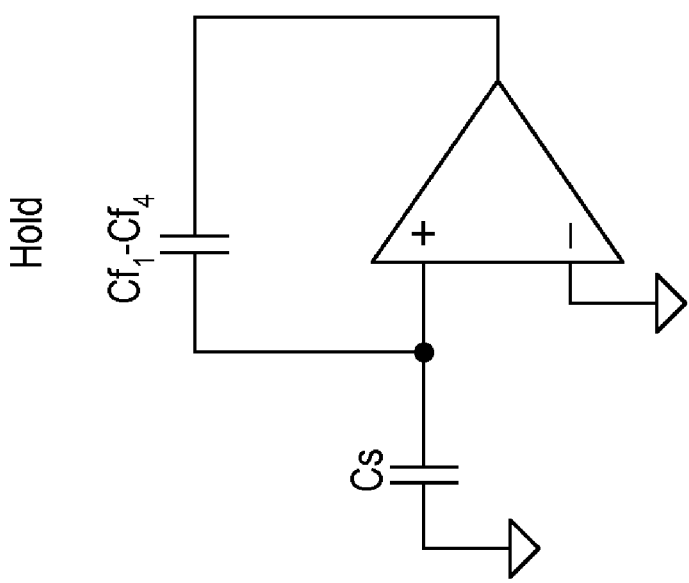

Another important feature of the first stage circuit of the present invention is that the use of capacitor sharing enables fast opamp operation without increasing power consumption. The capacitor sharing scheme in the first stage circuit of the present invention is further illustrated in the equivalent circuit diagrams of FIGS. 6(a) and 6(b). FIG. 6(a) illustrates the equivalent circuit diagram of the first stage circuit of FIG. 3 in the hold phase while FIG. 6(b) illustrates the equivalent circuit diagram of the first stage circuit of FIG. 3 during the MDAC phase.

Figure 1:
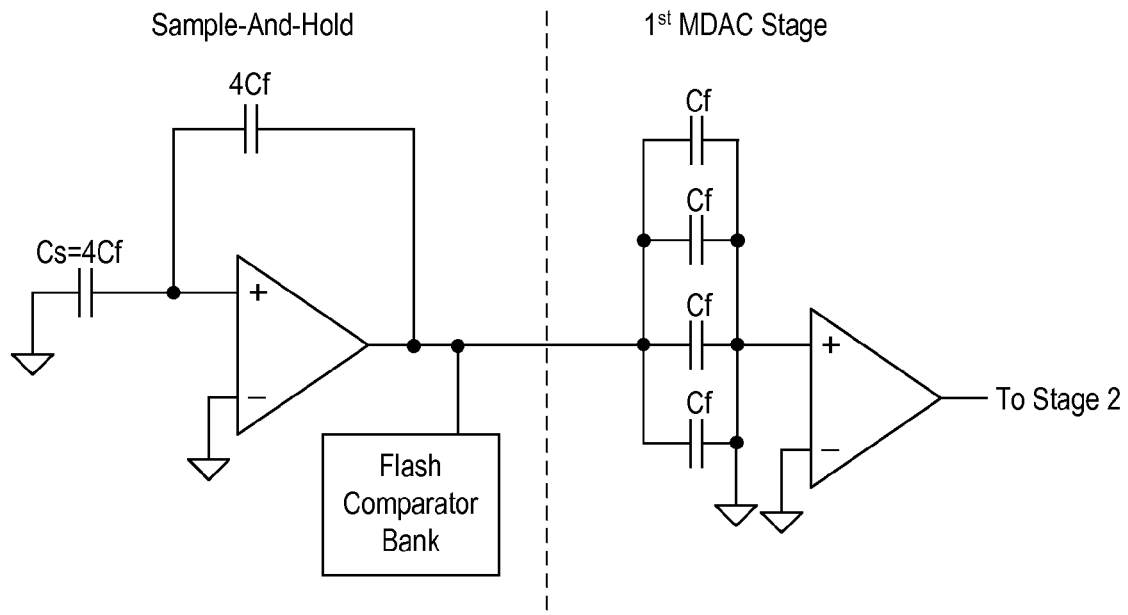
FIG. 1 is a circuit diagram of the input stages of a conventional switched-capacitor pipeline ADC.

First, returning to FIG. 1, in the input stages of a conventional pipeline ADC, the first MDAC stage samples the output of the SAH and the charge stored on capacitor "4Cf" of the sample and hold stage is thrown away.

Now, in accordance with the present invention, during the hold phase, the sampled signal is stored on the four feedback capacitors $Cf_1$ to $Cf_4$ (FIG. 6(a)). Then, in the following MDAC phase, the same capacitors $Cf_1$ to $Cf_4$ are directly used in the MDAC operation (FIG. 6(b)). By sharing the feedback capacitors, there is no need for the MDAC stage to sample the SAH stage as is required in the conventional circuit which results in a significant reduction of the opamp output load capacitance at the SAH stage.

More specifically, the opamp output load capacitance of a conventional SAH is given as:

$$C_L = (1-\beta) \cdot 4C_f + 4C_f + C_p \text{(paracitics)}.$$

Meanwhile, the opamp output load capacitance of the first stage circuit of the present invention implementing capacitor sharing is given as:

$$C_L' = (1-\beta) \cdot 4C_f + C_p \text{(paracitics), where } \beta \text{ (feedback factor)} \approx 0.4$$

A comparison of the two load capacitances yields:

$$\frac{C_L'}{C_L} \approx 0.5.$$

As shown in above equations, the capacitor sharing scheme of the present invention reduces the output load capacitance of the opamp at the hold mode almost by 50%. The settling time for the first stage circuit of the present invention is then also made almost half of the conventional case. This reduction in cycle time is sufficient to more than compensate for the capacitor discharging time required in the discharge phase. The reduction in cycle time also further decreases the opamp power consumption. The first stage circuit of the present invention also benefits from reduced chip area and reduced noise. In one embodiment, the first stage circuit of the present invention is implemented in a 14 bits, 80 MS/s pipeline ADC. A 25% reduction in total ADC power consumption is observed without any performance degradation.

Alternate Embodiments

Figure 7:
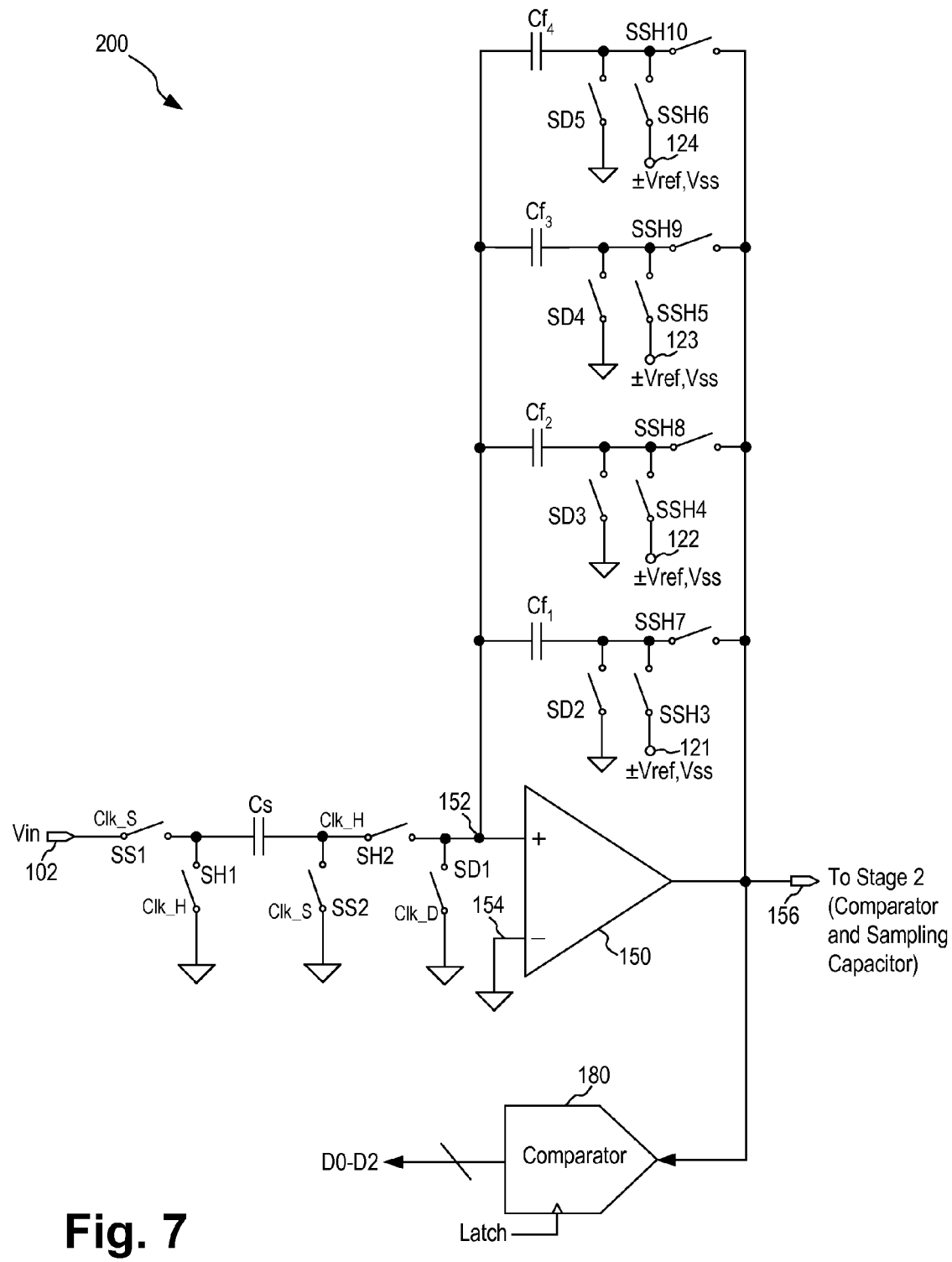
FIG. 7 is a circuit diagram of a first stage circuit for a pipeline ADC according to an alternate embodiment of the present invention.

FIG. 7 is a circuit diagram of a first stage circuit for a pipeline ADC according to an alternate embodiment of the present invention. A first stage circuit 200 in FIG. 7 forming the first pipeline stage of a pipeline ADC has the same construction as first stage circuit 100 of FIG. 3 except that first stage circuit 200 of FIG. 7 implements capacitor swapping in the feedback capacitor array. Like elements in FIGS. 3 and 7 are given like reference numerals and will not be further described.

Referring to FIG. 7, first stage circuit 200 includes a feedback capacitor arrays of capacitors $Cf_{1-4}$ have the same capacitance values. In the present embodiment, each feedback capacitors $Cf_{1-4}$ in the array has a first plate connected to the positive input terminal 152 of opamp 150 and a second plate connected to a respective switches SD2 to SD5. Switches SD2 to SD5 connect the second plates of the feedback capacitors to the Vss or ground node for the discharge operation.

The second plate of each of the feedback capacitors $Cf_{1-4}$ is further connected to a respective switch SSH3 to SSH6. Switches SSH3 and SSH6 connect the second plate of the feedback capacitors $Cf_{1-4}$ to the respective reference voltage nodes 121-124. In the present embodiment, all the reference voltage nodes, including node 121, are connected to a reference voltage selected from +Vref, −Vref, or Vss. The second plate of each of the feedback capacitors $Cf_{1-4}$ is further connected to a respective switch SSH7 to SSH10. Switches SSH7 and SSH10 connect the second plate of the feedback capacitors $Cf_{1-4}$ to the output terminal 156 of opamp 150. As thus configured, the feedback capacitor array of first stage circuit 200 realizes complete symmetry where each feedback capacitor in the array has the same construction as the others.

More specifically, in first stage circuit 200, there is no fixed feedback capacitor configured to be in the feedback path for the MDAC operation. Instead, any one of the feedback capacitors in the array can be programmed for use as the feedback capacitor in the feedback path. Switches SSH3 to SSH10 are controlled by program control signals, which are related to the clock signals Clk_S and Clk_H, to allow one of the feedback capacitors $Cf_{1-4}$ to be connected in the feedback path and the others to be connected to the reference voltage nodes in the MDAC mode. Furthermore, switches SSH3 to SSH10 are controlled by program control signals so that switches SSH3 to SSH6 are open and SSH7 to SSH10 are closed in the Hold mode. Finally switches SSH3 to SSH10 are controlled by program control signals to be open during the Discharge mode.

By allowing the programmable selection of the feedback capacitor to be used in the feedback path in the MDAC operation, the first stage circuit of the present invention can be operated to avoid capacitor mismatch effects, thereby improving the performance of the pipeline ADC.

The above detailed descriptions are provided to illustrate specific embodiments of the present invention and are not intended to be limiting. Numerous modifications and variations within the scope of the present invention are possible. The present invention is defined by the appended claims.

We claim:

1. A first stage circuit for a pipeline analog-to-digital converter (ADC), the first stage circuit receiving an analog input voltage and generating a first stage residue value for the pipeline ADC, the first stage circuit comprising:
a sampling capacitor have a first plate switchably connected to the analog input voltage and a second plate;
an amplifier having a positive input terminal switchably connected to the second plate of the sampling capacitor, a negative input terminal connected to a first power supply voltage and an output terminal;
a plurality of feedback capacitors, each of the feedback capacitors having a first plate connected to the positive input terminal of the amplifier and a second plate switchably connected to the first power supply voltage and also switchably connected to the output terminal of the amplifier, the plurality of feedback capacitors except a first one of the feedback capacitors also having the second plates switchably connected to a selected reference voltage; and
a comparator having an input terminal coupled to the output terminal of the amplifier, and an output terminal providing a digital control signal, the comparator providing the digital control signal in response to a first signal to select the selected reference voltage from a plurality of reference voltages for each of the plurality of feedback capacitors except the first one,
wherein the sampling capacitor, the amplifier and the plurality of feedback capacitors are configured by a plurality of control signals to operate in a first mode to sample the input voltage onto the sampling capacitor and to perform a MDAC (multiplying digital-to-analog converter) function using the plurality of feedback capacitors to provide the first stage residue value at the output terminal of the amplifier, a second mode to discharge the plurality of feedback capacitors, and a third mode to transfer the sampled input voltage from the sampling capacitor to the plurality of feedback capacitors, the first signal causing the comparator to generate the digital control signal during the third mode.

2. The first stage circuit of claim 1, wherein the plurality of reference voltages comprises a positive reference voltage, a negative reference voltage and the first power supply voltage.

3. The first stage circuit of claim 2, wherein the first power supply voltage comprises a ground voltage or a negative power supply voltage.

4. The first stage circuit of claim 1, wherein the sampling capacitor has a capacitance value of Cs and each of the plurality of feedback capacitors has a capacitance value of Cf, and Cs=m*Cf where m is the number of feedback capacitors.

5. The first stage circuit of claim 1, further comprising:
a first set of switches being controlled by a first control signal and being coupled to the sampling capacitor and to the plurality of feedback capacitors, the first set of switches configuring the sampling capacitor and the plurality of feedback capacitors to operate in the first mode in response to the first control signal;
a second set of switches being controlled by a second control signal and being coupled to the plurality of feedback capacitors, the second set of switches configuring the plurality of feedback capacitors to operate in the second mode in response to the second control signal; and
a third set of switches being controlled by a third control signal and being coupled to the sampling capacitor and to the plurality of feedback capacitors, the third set of switches configuring the sampling capacitor and the plurality of feedback capacitors to operate in the third mode in response to the third control signal.

6. The first stage circuit of claim 5, wherein the first set of switches, in response to the first control signal, connects the sampling capacitor across the input voltage and the first power supply voltage, connects the first one of the feedback capacitors across the positive input terminal and the output terminal of the amplifier, and connects the plurality of the feedback capacitors except the first one across the positive input terminal of the amplifier and the respective selected reference voltages.

7. The first stage circuit of claim 5, wherein the second set of switches, in response to the second control signal, connects the plurality of the feedback capacitors across the first power supply voltage to discharge the feedback capacitors, the sampling capacitor being left floating.

8. The first stage circuit of claim 5, wherein the third set of switches, in response to the third control signal, connects the sampling capacitor across the first power supply voltage and the positive input terminal of the amplifier, and connects the plurality of the feedback capacitors across the positive input terminal and the output terminal of the amplifier.

9. The first stage circuit of claim 6, wherein the third set of switches, in response to the third control signal, connects the sampling capacitor across the first power supply voltage and the positive input terminal of the amplifier, and connects the plurality of the feedback capacitors across the positive input terminal and the output terminal of the amplifier, and wherein the first set of switches and the third set of switches comprise a single switch connecting the second plate of the first one of the feedback capacitors to the output terminal of the amplifier, the single switch being controlled by a control signal related to the first and third control signal.

10. The first stage circuit of claim 5, wherein the first set of switches, being controlled by the first control signal comprises:
a first switch coupled between the input voltage and the first plate of the sampling capacitor;

a second switch coupled between the second plate of the sampling capacitor and the first power supply voltage;

a third switch coupled between the second plate of the first one of the feedback capacitor and the output terminal of the amplifier; and a fourth set of switches coupled between the respective second plates of the plurality of feedback capacitors except the first one and the respective selected reference voltages.

11. The first stage circuit of claim 5, wherein the second set of switches comprises:

a fifth switch coupled between the positive input terminal of the amplifier and the first power supply voltage; and a sixth set of switches coupled between the respective second plates of the plurality of feedback capacitors and the first power supply voltage.

12. The first stage circuit of claim 5, wherein the third set of switches comprises:

a seventh switch coupled between the first plate of the sampling capacitor and the first power supply voltage;

an eighth switch coupled between the second plate of the sampling capacitor and the positive input terminal of the amplifier; and a ninth set of switches coupled between the respective second plates of the plurality of feedback capacitors and the output terminal of the amplifier.

13. A first stage circuit for a pipeline analog-to-digital converter (ADC), the first stage circuit receiving an analog input voltage and generating a first stage residue value for the pipeline ADC, the first stage circuit comprising:

a sampling capacitor have a first plate switchably connected to the analog input voltage and a second plate;

an amplifier having a positive input terminal switchably connected to the second plate of the sampling capacitor, a negative input terminal connected to a first power supply voltage and an output terminal;

a plurality of feedback capacitors, each of the feedback capacitors having a first plate connected to the positive input terminal of the amplifier and a second plate switchably connected to the first power supply voltage, also switchably connected to the output terminal of the amplifier, and also switchably connected to a selected reference voltage; and a comparator having an input terminal coupled to the output terminal of the amplifier, and an output terminal providing a digital control signal, the comparator providing the digital control signal in response to a first signal to select the selected reference voltage from a plurality of reference voltages for each of the plurality of feedback capacitors except the first one, wherein the sampling capacitor, the amplifier and the plurality of feedback capacitors are configured by a plurality of control signals to operate in a first mode to sample the input voltage onto the sampling capacitor and to perform a MDAC (multiplying digital-to-analog converter) function using the plurality of feedback capacitors to provide the first stage residue value at the output terminal of the amplifier, a second mode to discharge the plurality of feedback capacitors, and a third mode to transfer the sampled input voltage from the sampling capacitor to the plurality of feedback capacitors, the first signal causing the comparator to generate the digital control signal during the third mode.

14. The first stage circuit of claim 13, wherein the plurality of reference voltages comprises a positive reference voltage, a negative reference voltage and the first power supply voltage.

15. The first stage circuit of claim 14, wherein the first power supply voltage comprises a ground voltage or a negative power supply voltage.

16. The first stage circuit of claim 13, wherein the sampling capacitor has a capacitance value of Cs and each of the plurality of feedback capacitors has a capacitance value of Cf, and Cs=m*Cf where m is the number of feedback capacitors.

17. The first stage circuit of claim 13, further comprising:

a first set of switches being controlled by a first control signal and being coupled to the sampling capacitor for configuring the sampling capacitor to operate in the first mode in response to the first control signal;

a second set of switches being controlled by a second control signal and being coupled to the plurality of feedback capacitors, the second set of switches configuring the plurality of feedback capacitors to operate in the second mode in response to the second control signal;

a third set of switches being controlled by a third set of programmable control signals and being coupled to the plurality of feedback capacitors, the third set of switches configuring the plurality of feedback capacitors to operate in the first mode in response to the third set of programmable control signals; and a fourth set of switches being controlled by a fourth set of programmable control signals and being coupled to the plurality of feedback capacitors, the fourth set of switches configuring the plurality of feedback capacitors to operate in the third mode in response to the fourth set of programmable control signals.

18. The first stage circuit of claim 17, wherein the first set of switches, in response to the first control signal, connects the sampling capacitor across the input voltage and the first power supply voltage to sample the input voltage, and the third and forth sets of switches, in response to the third and fourth sets of programmable control signals, connect the second plate of one of the feedback capacitors to the output terminal of the amplifier and connect the second plates of the remaining feedback capacitors to the respective selected reference voltage.

19. The first stage circuit of claim 17, wherein the second set of switches, in response to the second control signal, connects the plurality of the feedback capacitors across the first power supply voltage to discharge the feedback capacitors, the sampling capacitor being left floating.

20. The first stage circuit of claim 17, wherein the forth set of switches, in response to the fourth set of programmable control signals, connects the second plates of the plurality of feedback capacitors to the output terminal of the amplifier.

* * * * *

UNITED STATES PATENT AND TRADEMARK OFFICE
CERTIFICATE OF CORRECTION

| | |
|---|---|
| PATENT NO. | : 7,265,705 B1 |
| APPLICATION NO. | : 11/463813 |
| DATED | : September 4, 2007 |
| INVENTOR(S) | : Byung-Geun Lee and Byung-Moo Min |

Page 1 of 1

It is certified that error appears in the above-identified patent and that said Letters Patent is hereby corrected as shown below:

Column 12, line 55, claim 20: Cancel "forth" and substitute --fourth--.

Signed and Sealed this

Twenty-third Day of September, 2008

JON W. DUDAS
*Director of the United States Patent and Trademark Office*